United States Patent
Matsufuji

(10) Patent No.: US 12,006,264 B2
(45) Date of Patent: Jun. 11, 2024

(54) POROUS CERAMIC, MEMBER FOR SEMICONDUCTOR MANUFACTURING APPARATUS, SHOWER PLATE AND PLUG

(71) Applicant: KYOCERA Corporation, Kyoto (JP)

(72) Inventor: Hiromasa Matsufuji, Higashiomi (JP)

(73) Assignee: Kyocera Corporation, Kyoto (JP)

(*) Notice: Subject to any disclaimer, the term of this patent is extended or adjusted under 35 U.S.C. 154(b) by 650 days.

(21) Appl. No.: 17/288,343

(22) PCT Filed: Oct. 24, 2019

(86) PCT No.: PCT/JP2019/041682
§ 371 (c)(1),
(2) Date: Apr. 23, 2021

(87) PCT Pub. No.: WO2020/090613
PCT Pub. Date: May 7, 2020

(65) Prior Publication Data
US 2021/0380487 A1 Dec. 9, 2021

(30) Foreign Application Priority Data
Oct. 30, 2018 (JP) ................................. 2018-203822

(51) Int. Cl.
*C04B 35/505* (2006.01)
*C04B 38/00* (2006.01)
*H01J 37/32* (2006.01)

(52) U.S. Cl.
CPC ........ *C04B 35/505* (2013.01); *C04B 38/0054* (2013.01); *H01J 37/3244* (2013.01); *C04B 2235/3225* (2013.01); *C04B 2235/3248* (2013.01); *H01J 2237/334* (2013.01)

(58) Field of Classification Search
CPC .......................... C04B 35/505; C04B 38/0054
See application file for complete search history.

(56) References Cited

U.S. PATENT DOCUMENTS

2018/0265972 A1* 9/2018 Firouzdor ............. C23C 16/402

FOREIGN PATENT DOCUMENTS

| JP | H6-58434 A | 3/1994 |
|---|---|---|
| JP | H9-132459 A | 5/1997 |
| JP | 2000-1362 A | 1/2000 |
| JP | 2003-282462 A | 10/2003 |
| JP | 2018-162205 A | 10/2018 |

* cited by examiner

Primary Examiner — Matthew E. Hoban
(74) Attorney, Agent, or Firm — Procopio, Cory, Hargreaves & Savitch LLP

(57) ABSTRACT

A porous ceramic of the present disclosure contains yttrium zirconate and yttrium oxide, and at least one of them is a main component. A member for a semiconductor manufacturing apparatus such as a shower plate, a plug or the like in a semiconductor manufacturing apparatus is made of the above porous ceramic.

12 Claims, 3 Drawing Sheets

POROUS CERAMIC, MEMBER FOR SEMICONDUCTOR MANUFACTURING APPARATUS, SHOWER PLATE AND PLUG

TECHNICAL FIELD

The present disclosure relates to a porous ceramic and a member for a semiconductor manufacturing apparatus such as a shower plate, a plug or the like provided with the porous ceramic.

BACKGROUND

Conventionally, in a semiconductor manufacturing apparatus such as a plasma etching apparatus, as shown in Patent Document 1, a high-frequency voltage is applied between a substrate such as a semiconductor wafer mounted on a substrate supporting assembly and a shower plate (gas distribution plate) introducing plasma generating gas and supplying it toward the substrate to form a plasma state, and then a film is formed on the surface of the substrate, or the thin film formed on the surface of the substrate is etched.

This substrate supporting assembly is provided with a through hole for supplying a cooling gas such as helium or the like in the thickness direction thereof, and a plug made of porous ceramic such as AlO/SiO, AlO/MgO/SiO, SiC, SiN, AlN/SiO or the like is inserted into the through hole.

Further, Patent Document 2 suggests a shower plate made of a ceramic porous body containing alumina of 99.5% by weight or more and having a porosity of 30 to 65%.

PRIOR ART DOCUMENTS

Patent Documents

Patent Document 1: Japanese Unexamined Patent Publication No. 2018-162205
Patent Document 2: Japanese Unexamined Patent Publication No. 2003-282462

SUMMARY

A porous ceramic of the present disclosure contains yttrium zirconate and yttrium oxide, and at least one of them is a main component.

A member for a semiconductor manufacturing apparatus of the present disclosure includes the above porous ceramic.

A shower plate of the present disclosure includes the above member for the semiconductor manufacturing apparatus.

A plug of the present disclosure includes the above member for the semiconductor manufacturing apparatus.

EMBODIMENT

Figure 1:
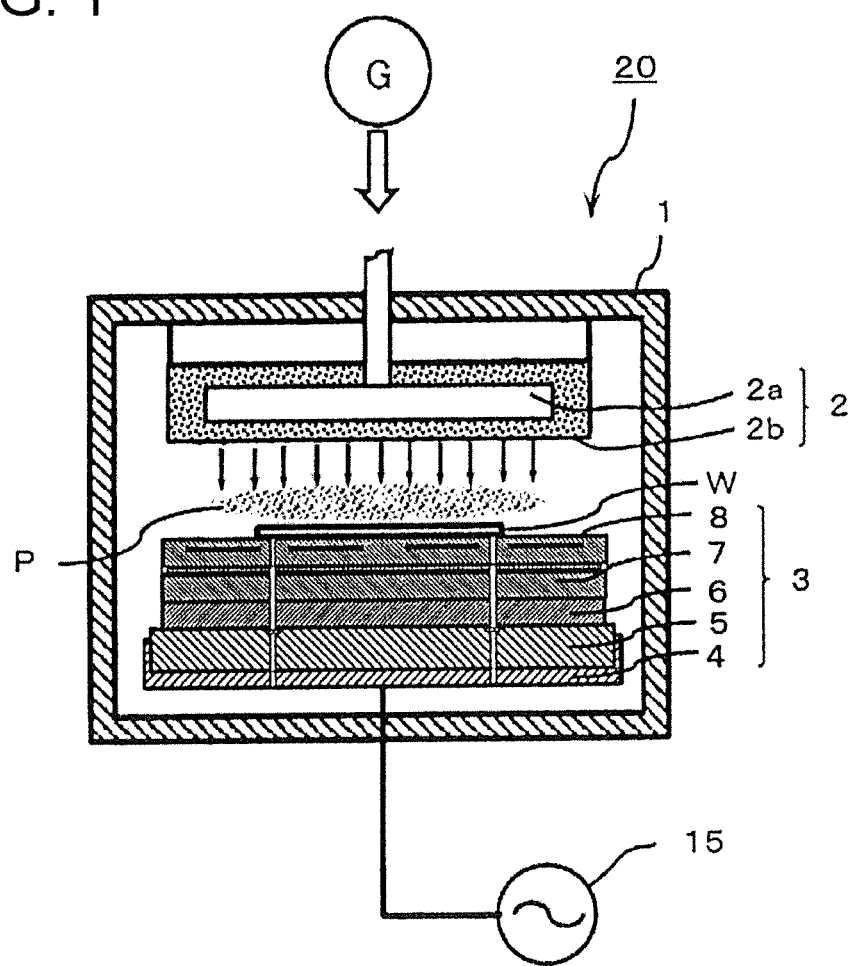
FIG. 1 is a sectional view showing a part of a plasma processing apparatus provided with a shower plate and a plug, which are members for the semiconductor manufacturing apparatus of the present disclosure.

Hereinafter, the embodiment of the present disclosure is described in detail with reference to the drawings. However, in all the figures of the present description, the same parts are designated by the same reference numerals and the description thereof will be omitted as appropriate unless confusion occurs.

Figure 2:
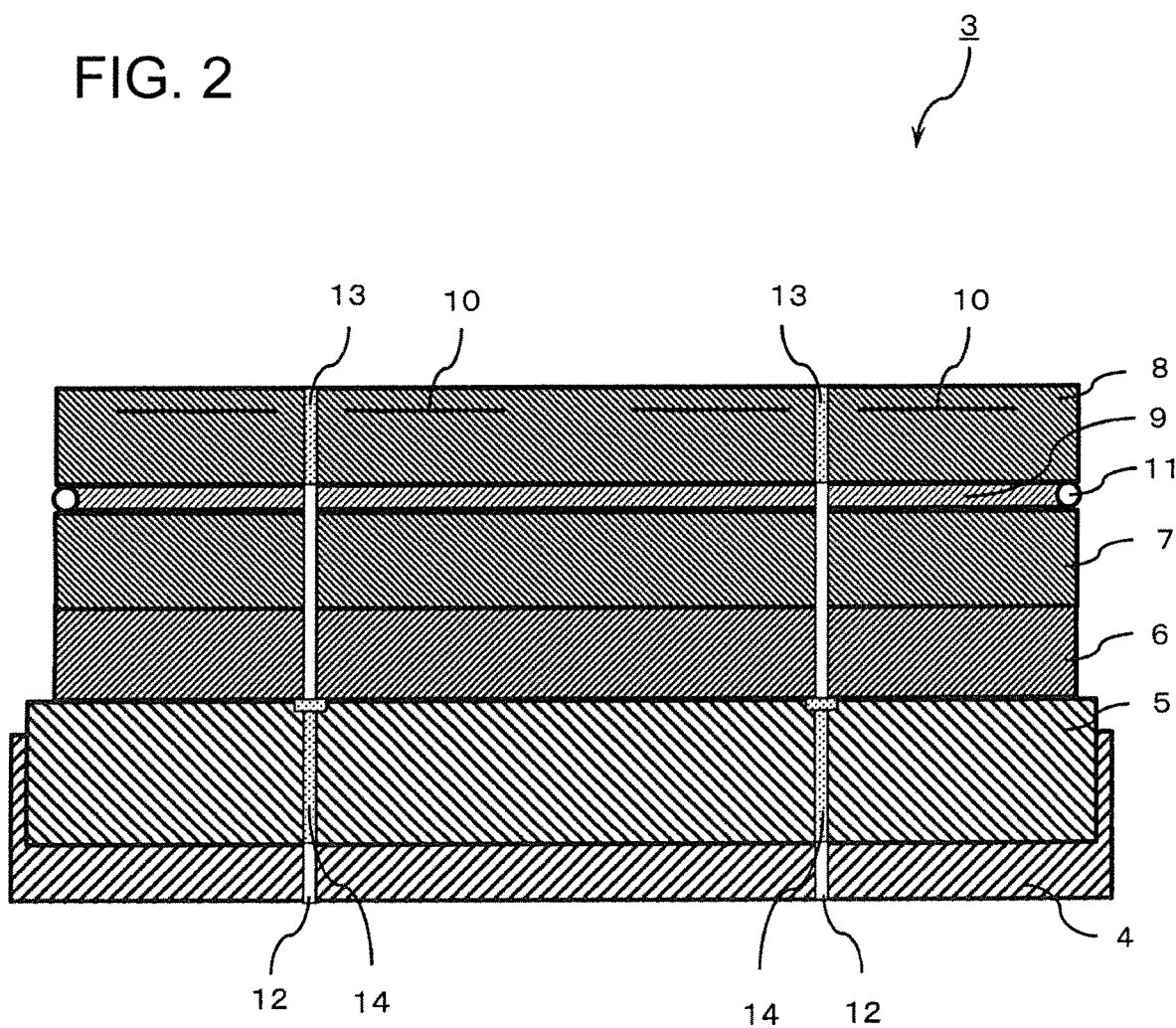
FIG. 2 is an enlarged sectional view of a substrate supporting assembly arranged inside the plasma processing apparatus shown in FIG. 1.

FIG. 1 is a sectional view showing a part of a plasma processing apparatus provided with a shower plate and a plug, which are members for the semiconductor manufacturing apparatus of the present disclosure. FIG. 2 is an enlarged sectional view of a substrate supporting assembly arranged inside the plasma processing apparatus shown in FIG. 1.

The plasma processing apparatus 20 shown in FIG. 1 is, for example, a plasma etching apparatus, and includes a chamber 1 in which a workpiece W such as a semiconductor wafer or the like is arranged, a shower plate 2 arranged on the upper side in the chamber 1, and a substrate supporting assembly 3 arranged on the lower side and opposed to the shower plate 2.

The shower plate 2 includes a diffusion part 2a which is an internal space for diffusing plasma generating gas G, and a gas supplying part 2b made of a porous ceramic having a large number of gas passages (pores) for supplying the plasma generating gas G into the chamber 1.

Then, the plasma generating gas G discharged in the form of a shower from the gas supplying part 2b becomes plasma by supplying high frequency power from a high frequency power supply 15, and then it forms a plasma space P.

Here, examples of the plasma generating gas G include fluorine-based gases such as $SF_6$, $CF_4$, $CHF_3$, $ClF_3$, $NF_3$, $C_4F_8$, and HF, and chlorine-based gases such as $Cl_2$, HCl, $BCl_3$, and $CCl_4$.

The substrate supporting assembly 3 is an electrostatic chuck including a mounting part 4, an insulating part 5, a supporting part 6, a heat conductive part 7, and an electrostatic adsorption part 8. The electrostatic adsorption part 8 is, for example, connected to the heat conductive part 7 via a connecting layer 9 made of a silicone adhesive, as shown in FIG. 2.

The electrostatic adsorption part 8 holds the workpiece W by an electrostatic adsorption force, and a plurality of clamp electrodes 10 are arranged in its inside. The clamp electrode 10 is electrically connected to a high frequency power source via a matching circuit for maintaining the plasma P generated from the plasma generating gas G in the chamber 1.

Then, a coating film formed on the surface of the workpiece W is etched by ions and radicals contained in plasma.

An O ring 11 is attached around the connecting layer 9 and is for protecting the connecting layer 9. The insulating part 5 is, for example, made of plastic, and is electrically insulated from the mounting part 4. The substrate supporting assembly 3 includes a through hole 12 penetrating in the vertical direction. Plugs 13 and 14 are inserted into the through hole 12. That is, the plug 13 is arranged in the through hole 12 in the electrostatic adsorption part 8, and the plug 14 is arranged in the through hole 12 in the insulating part 5, respectively. The plug 13 is a straight cylindrical body, and the plug 14 is a cylindrical body provided with a cylindrical shaft part and a flange part at one end of the shaft part that is larger than the diameter of the shaft part. The through hole 12 is a passage for supplying helium gas for cooling into the chamber 1.

The plugs 13 and 14 can capture particles floating in the plasma P as the plasma P used to clean the chamber 1 passes through the through hole 12, and can suppress the entry of such particles into the substrate supporting assembly 3.

Additionally, the plugs 13 and 14 can suppress generation of secondary plasma in the through hole 12.

The member for the semiconductor manufacturing apparatus of the present disclosure, such as the plug, shower plate or the like, is made of a porous ceramic containing yttrium zirconate and yttrium oxide, and containing at least one of them as a main component.

With such a configuration, high corrosion resistance to plasma is increased while mechanical strength is maintained, and thus it can be used for a long period of time, since yttrium zirconate having high mechanical strength and yttrium oxide having high corrosion resistance to plasma are contained, and at least one of them is the main component.

Specifically, the porous ceramic of the present disclosure includes the following three types.

(1) A porous ceramic containing yttrium zirconate as a main component and further containing yttrium oxide.
(2) A porous ceramic containing yttrium oxide as a main component and further containing yttrium zirconate.
(3) A porous ceramic containing yttrium zirconate and the yttrium oxide as main components.

Here, the main component of the porous ceramic refers to a component containing 50 mol % or more of the total 100 mol % of the components of the porous ceramic. Each component of the porous ceramic can be identified by using an X-ray diffractometer (XRD), and the molar ratio of each component can be determined by the Rietveld method using XRD.

If yttrium zirconate is the main component, the molar ratio of yttrium oxide is 20 mol % or more, and if yttrium oxide is the main component, the molar ratio of yttrium zirconate is 20 mol % or more.

If the molar ratios of yttrium zirconate and yttrium oxide are both 50 mol %, both are the main components.

The composition formula of yttrium zirconate is expressed as, for example, $YZrO_x$ (3≤x≤3.5), $YZr_2O_7$, $Y_2ZrO_5$, $Y_2Zr_2O_3$, $Zr_{0.92}Y_{0.08}O_{2.96}$ or the like.

In addition to yttrium zirconate and yttrium oxide, the porous ceramic may contain at least one of Si, Fe, Al and an element of Group 2 of the periodic table (hereinafter, the element of Group 2 of the periodic table is referred to as AE) as an oxide, and Si may be 300 mass ppm or less in terms of SiO2, Fe may be 50 mass ppm or less in terms of $Fe_2O_3$, Al may be 100 mass ppm or less in terms of $Al_2O_3$, and AE may be 350 mass ppm or less in terms of AEO.

The content of these elements may be determined by an ICP (Inductively Coupled Plasma) emission spectroscopic analyzer and converted into the above oxides, respectively.

Further, the porous ceramic may contain at least one of iron, cobalt and nickel, and the total content of these metal elements may be 0.1% by mass or less.

If the total content of these metal elements is 0.1% by mass or less, the porous ceramic can be made non-magnetic, so that the porous ceramic can be used as a member of a device that requires suppression of influences of magnetic of, for example, an electron beam exposure device or the like.

The content of each of these metal elements can be determined by using a glow discharge mass spectrometer (GDMS).

Here, the porous ceramic of the present disclosure refers to a ceramic having a porosity of 10% by volume or more, and the porosity can be determined by a mercury intrusion method.

The porous ceramic may have a pore area occupancy of 20 to 45 area %. If the pore area occupancy is in this range, it is possible to suppress thermal stress generated even if the temperature is repeatedly increased and decreased while a large decrease in mechanical strength is suppressed.

The porous ceramic may have a mean pore diameter of 1 μm to 6 μm. If the mean pore diameter is in this range, it is possible to reduce the particles generated from the periphery of the pores and the inside of the pores even if the plasma generating gas passes through, while a large decrease in mechanical strength is suppressed.

A kurtosis of the pore diameter may be 2 or more. If the kurtosis of the pore diameter is in this range, the number of pores having an abnormally large diameter is reduced, so that the particles generated from the inside of the pores can be relatively reduced.

A skewness of the pore diameter may be 0 or more. If the skewness of the pore diameter is in this range, the number of pores having a small diameter is relatively large, so that the generation ratio of large particles can be reduced.

The pore area occupancy and the mean pore diameter are measured by using an image analysis software "Win ROOF (Ver. 6.1.3)" (produced by Mitani Corporation) with a magnification of 100 times, a measurement range of $3.1585 \times 10^5$ μm² at one point on the surface, and a pore diameter threshold of 0.8 μm. The pore area occupancy and the mean pore diameter can be obtained by performing this measurement at four different points.

The kurtosis of the pore diameter may be obtained by using the function Kurt provided in Excel (registered trademark, Microsoft Corporation). The skewness of the pore diameter may be obtained by using the function Skew provided in Excel (registered trademark, Microsoft Corporation).

Figure 3:
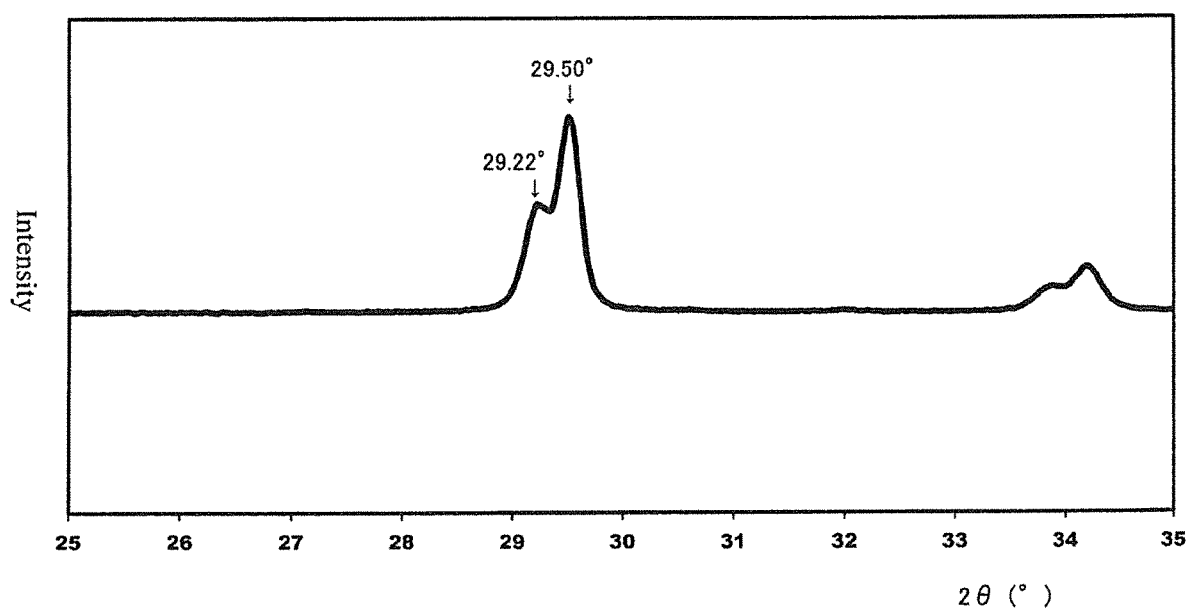
FIG. 3 is an example showing an X-ray diffraction pattern of the porous ceramic of the present disclosure.

FIG. 3 is an example showing an X-ray diffraction pattern of the porous ceramic of the present disclosure. The position of a diffraction peak $I_1$ on a (222) surface of yttrium zirconate ($YZrO_3$) is at a diffraction angle (2θ) of 29.333° according to the card shown in PDF (registered trademark) Number: 01-089-5593.

Further, the position of a diffraction peak $I_2$ on a (222) plane of yttrium oxide ($Y_2O_3$) is at a diffraction angle (2θ) of 29.211° according to the card shown in PDF (registered trademark) Number: 01-071-0099. In the example shown in FIG. 3, a diffraction angle ($2θ_1$) of the diffraction peak $I_1$ of the (222) surface of yttrium zirconate ($YZrO_3$) obtained by X-ray diffraction using CuKα rays is 29.22°, and a shift amount $Δ_1$ is 0.113° to the low angle side. A diffraction angle ($2θ_2$) of the diffraction peak $I_2$ of the (222) surface of yttrium oxide ($Y_2O_3$) is 29.50°, and a shift amount $Δ_2$ is 0.289° to the high angle side.

In the porous ceramic of the present disclosure, as shown in FIG. 3, the diffraction peak $I_1$ may be shifted to the low angle side, and the diffraction peak $I_2$ may be shifted to the high angle side. If the diffraction peak $I_1$ is shifted to the low angle side, a lattice spacing of the crystal particles becomes large, and a tensile stress remains in the crystal lattice. On the contrary, if the diffraction peak $I_2$ is shifted to the high angle side, a lattice spacing of the crystal particles becomes small, and a compressive stress remains in the crystal lattice. If the tensile stress and the compressive stress remain in this way, they work to offset each other, so that it becomes difficult to detach.

Additionally, in the porous ceramic, absolute values of the shift amount $Δ_1$ of the diffraction peak $I_1$ and the shift amount $Δ_2$ of the diffraction peak $I_2$ may both be 0.5° or less. If the shift amount $Δ_1$ and the shift amount $Δ_2$ are in this range, the strain accumulated in the crystal lattice becomes small, so that it can be used for a long period of time.

Next, an example of the method for manufacturing the porous ceramic of the present disclosure will be described.

Yttrium oxide powder and zirconium oxide powder are prepared. Yttrium oxide and zirconium oxide are mixed so as to have a molar ratio of 55 to 65:45 to 35, and then wet-mixed and granulated to obtain granules made of yttrium oxide and zirconium oxide.

Here, to obtain a porous ceramic in which the diffraction peak $I_1$ of the (222) surface of yttrium zirconate ($YZrO_3$) is shifted to the low angle side and the diffraction peak $I_2$ of the (222) surface of yttrium oxide ($Y_2O_3$) is shifted to the high angle side, a mean particle diameter D50 of the wet-mixed mixed powder may be set to 0.8 µm to 0.9 µm.

To obtain a porous ceramic in which the absolute values of the shift amount $\Delta_1$ of the diffraction peak $I_1$ and the shift amount $\Delta_2$ of the diffraction peak $I_2$ are both 0.5° or less, the mean particle diameter D50 of the wet-mixed mixed powder may be set to 0.82 µm to 0.88 µm.

Further, to obtain a porous ceramic containing at least one of iron, cobalt and nickel and having a total content of these metal elements of 0.1% by mass or less, an iron removal equipment may be used to perform an iron removal process, for example, with a magnetic flux density of 1 tesla and a treatment time of 60 minutes or more. The granules are filled in a molding die and molded into a predetermined shape (for example, columnar shape, disc shape or the like) by a dry pressure molding method, a cold hydrostatic pressure molding method or the like. The molding pressure is preferably set to, for example, 78 MPa to 118 MPa.

A molded body obtained by molding is sintered in an air atmosphere with a holding temperature of 1200 to 1600° C. and a holding time of 1 to 5 hours or less. Thereby, the porous ceramic of the present disclosure can be obtained.

Further, to obtain a porous ceramic having a pore area occupancy of 20 to 45 area %, the holding temperature may be set to 1250 to 1550° C.

Additionally, to obtain a porous ceramic having a mean pore diameter of 1 µm to 6 µm, the molding pressure may be set to, for example, 88 MPa to 108 MPa, and the holding temperature may be set to 1250 to 1550° C.

The member for the semiconductor manufacturing apparatus provided with the porous ceramic of the present disclosure obtained by the above manufacturing method includes yttrium zirconate having high mechanical strength and yttrium oxide having high corrosion resistance to plasma, and at least one of them is the main component, so that the corrosion resistance to plasma is high while the mechanical strength is maintained, and thus it can be used for a long period of time.

DESCRIPTION OF THE REFERENCE NUMERAL 1 chamber
2 shower plate
3 substrate supporting assembly
4 mounting part
5 insulating part
6 supporting part
9 connecting layer
10 clamp power supply
11 O ring
12 through hole
13 plug
14 plug
15 high frequency power supply
20 plasma processing apparatus

The invention claimed is:

1. A porous ceramic comprising yttrium zirconate and yttrium oxide, wherein at least one of them is a main component.

2. The porous ceramic according to claim 1, comprising the yttrium zirconate as a main component and further comprising yttrium oxide.

3. The porous ceramic according to claim 1, comprising the yttrium oxide as a main component and further comprising yttrium zirconate.

4. The porous ceramic according to claim 1, comprising the yttrium zirconate and the yttrium oxide as main components.

5. The porous ceramic according to claim 1, comprising a pore area occupancy of 20 to 45 area %.

6. The porous ceramic according to claim 1, comprising a mean pore diameter of 1 µm to 6 µm.

7. The porous ceramic according to claim 1, wherein a diffraction peak $I_1$ of a (222) surface of yttrium zirconate ($YZrO_3$) obtained by X-ray diffraction is shifted to a low angle side, and a diffraction peak $I_2$ of a (222) plane of yttrium oxide ($Y_2O_3$) is shifted to a high angle side.

8. The porous ceramic according to claim 7, wherein absolute values of a shift amount $\Delta_1$ of the diffraction peak $I_1$ and a shift amount $\Delta_2$ of the diffraction peak $I_2$ are both be 0.5° or less.

9. The porous ceramic according to claim 1, comprising at least one of iron, cobalt and nickel, wherein the total content of these metal elements is 0.1% by mass or less.

10. A member for a semiconductor manufacturing apparatus comprising the porous ceramic according to claim 1.

11. A shower plate comprising the member for the semiconductor manufacturing apparatus according to claim 10.

12. A plug comprising the member for the semiconductor manufacturing apparatus according to claim 10.

* * * * *